(12) United States Patent
Kim et al.

(10) Patent No.: US 7,602,454 B2
(45) Date of Patent: Oct. 13, 2009

(54) LIQUID CRYSTAL DISPLAY AND METHOD FOR FABRICATING THE SAME

(75) Inventors: Young-Joo Kim, Gyeonggi-Do (KR); Seok-Woo Lee, Gyeonggi-Do (KR); Soo-Jeong Park, Seoul (KR)

(73) Assignee: LG Display Co., Ltd, Seoul (KR)

( * ) Notice: Subject to any disclaimer, the term of this patent is extended or adjusted under 35 U.S.C. 154(b) by 307 days.

(21) Appl. No.: 11/642,879

(22) Filed: Dec. 21, 2006

(65) Prior Publication Data

US 2008/0002077 A1    Jan. 3, 2008

(30) Foreign Application Priority Data

Jun. 30, 2006  (KR) ...................... 10-2006-0061669
Dec. 7, 2006    (KR) ...................... 10-2006-0124001

(51) Int. Cl.
*G02F 1/136*    (2006.01)

(52) U.S. Cl. .......................................... 349/42; 349/43

(58) Field of Classification Search .............. 349/42–48
See application file for complete search history.

(56) References Cited

FOREIGN PATENT DOCUMENTS

JP    11-223834    8/1999

*Primary Examiner*—Kevin S Wood
(74) *Attorney, Agent, or Firm*—McKenna Long & Aldridge LLP

(57) ABSTRACT

A liquid crystal display and a method for fabricating the same are disclosed. The method for fabricating a liquid crystal display includes preparing an insulating substrate defining a TFT region of a pixel portion, forming an active layer on the substrate to cover the TFT region of the pixel region, forming a gate electrode of the pixel portion on the active layer, forming a source region of the pixel portion and a drain region of the pixel portion in the active layer at both sides of the gate electrode of the pixel portion, forming a passivation film having first and second contact holes on the substrate having the drain region of the pixel portion, the first and second contact holes respectively exposing the source region of the pixel portion and the drain region of the pixel portion, sequentially forming a transparent conductive film and a metal film on the passivation film, and selectively etching the metal film and the transparent conductive film to form a source electrode pattern of the pixel portion/a source electrode of the pixel portion, which are sequentially deposited to cover the first contact hole, and a drain electrode pattern of the pixel portion/a drain electrode of the pixel portion, which are sequentially deposited to cover the second contact hole.

28 Claims, 19 Drawing Sheets

LIQUID CRYSTAL DISPLAY AND METHOD FOR FABRICATING THE SAME

The present disclosure relates to subject matter contained in priority Korean Application No. 10-2006-0061669, filed on Jun. 30, 2006, which is incorporated by reference for all purposes as if fully incorporated herein.

BACKGROUND OF THE INVENTION

1. Field of the Invention

The present invention relates to a liquid crystal display and a method for fabricating the same, and more particularly, to a liquid crystal display and a method for fabricating the same, in which the number of masks is reduced to simplify fabricating process steps and improve yield.

2. Description of the Background Art

With the growth of the information economy, displays are used as visual information transmission media. The type of display to develop depends on requirements of low power consumption, thin profile, lightness in weight, and high picture quality. A liquid crystal display (LCD) corresponding to a main device of flat panel displays (FPDs) has performance that can satisfy such requirements and enables mass production. Accordingly, various new products based on the LCD have been fabricated, and the LCD has been widely used as a substitute for a cathode ray tube (CRT).

Generally, the LCD displays desired images by respectively supplying data signals according to image information to liquid crystal cells arranged in a matrix arrangement and controlling light transmittance of the liquid crystal cells.

The LCD mainly employs an active matrix driving mode in which an amorphous silicon thin film transistor (a-Si TFT) is used as a switching element to drive liquid crystals of a pixel portion.

The amorphous silicon thin film transistor has been practically used as a 3" liquid crystal portable television since 1986 as its concept had been established by LeComber of United Kingdom in 1979. Recently, a large scaled thin film transistor LCD of 50" or greater has been developed. Particularly, the amorphous silicon thin film transistor has been actively used as it enables low temperature process steps so as to use an insulating substrate of low cost.

However, the amorphous silicon thin film transistor has limitations on use in peripheral circuits that require high speed operation greater than 1 MHz, due to electric mobility of 1 $cm^2$/Vsec, In this respect, studies for simultaneously integrating a pixel portion and a driving circuit portion on a glass substrate using a polycrystalline silicon (poly-Si) thin film transistor are in progress, wherein the polycrystalline silicon thin film transistor has field effect mobility greater than that of the amorphous silicon thin film transistor.

The polycrystalline silicon thin film transistor has been used for a small sized module such as a camcorder since a liquid crystal color television had been developed in 1982. Since the polycrystalline silicon thin film transistor has advantages of low sensitivity and high field effect mobility, a driving circuit can be directly fabricated on the substrate.

Increase of mobility can improve the operational frequency of the driving circuit portion that determines the number of driving pixels. This facilitates fineness of the display. Also, since distortion of a transmission signal can be reduced by decrease of a signal voltage charging time of the pixel portion, it is possible to improve picture quality.

Furthermore, since the polycrystalline silicon thin film transistor can be driven at a voltage less than 10V in comparison with the amorphous silicon thin film transistor having a high driving voltage of 25V, it has an advantage of low power consumption.

Hereinafter, a structure of the LCD will be described in detail with reference to FIG. 1.

FIG. 1 is a plane view illustrating a structure of a general LCD, especially an LCD with a driving circuit integrated on an array substrate.

As illustrated in FIG. 1, the LCD includes a color filter substrate 5, an array substrate 10, and a liquid crystal layer (not illustrated) formed between the color filter substrate 5 and the array substrate 10.

The array substrate 10 includes a pixel portion 35 and a driving circuit portion 30, wherein the pixel portion 35 is an image display area in which unit pixels are arranged in a matrix arrangement, and the driving circuit portion 30 includes a data driving circuit 31 and a gate driving circuit 32, which are arranged along a contour of the pixel portion 35. Although not illustrated, the pixel portion 35 of the array substrate 10 includes a plurality of gate and data lines arranged on the substrate 10 in perpendicular and horizontal directions to define a plurality of pixel regions, thin film transistors formed in portions where the gate lines cross the data lines, and pixel electrodes formed in the pixel regions.

Each of the thin film transistors serves as a switching element that applies or blocks signal voltages to or off the pixel electrodes, and is a kind of field effect transistor (FET) that controls a flow of current using the electric field.

The driving circuit portion 30 of the array substrate 10 is positioned in the contour of the pixel portion 35 of the array substrate 10 more projected than the color filter substrate 5. The data driving circuit 31 is positioned at a long side of the projected array substrate 10 while the gate driving circuit 32 is positioned at a short side of the projected array substrate 10.

At this time, in the data driving circuit 31 and the gate driving circuit 32, a thin film transistor of a complementary metal oxide semiconductor (CMOS) structure serving as an inverter is used to properly output an input signal.

The CMOS is a kind of integrated circuit of a MOS structure used in the thin film transistor of the driving circuit portion that requires high speed signal processing, needs both an n channel thin film transistor and a p channel thin film transistor, and has speed and density characteristics corresponding to an intermediate level of NMOS and PMOS.

The gate driving circuit 32 and the data driving circuit 31 respectively supply scan signals and data signals to the pixel electrodes through the gate and data lines. Since the circuits 32 and 31 are connected with external signal input terminals (not illustrated), they serve to control external signals input through the external signal input terminals and output them to the pixel electrodes.

Furthermore, the pixel portion 35 of the color filter substrate 5 includes color filters (not illustrated) for displaying colors, and common electrodes (not illustrated) serving as opposite electrodes of the pixel electrodes formed in the array substrate 10.

The color filter substrate 5 and the array substrate 10 constructed as above are provided with a cell gap so that they are spaced apart from each other by a spacer (not illustrated). The color filter substrate 5 and the array substrate 10 are bonded to each other by a seal pattern (not illustrated) formed in the contour of the pixel portion 35 to form a unit LCD panel. At this time, the substrates 5 and 10 are bonded to each other by a bonding key formed in the color filter substrate 5 or the array substrate 10.

Since the aforementioned LCD with a driving circuit uses the polycrystalline silicon thin film transistor, it has advantages of excellent device characteristics, excellent picture quality, fineness, and low power consumption.

However, since the LCD with a driving circuit should be provided with the n channel thin film transistor and the p channel thin film transistor formed on a single substrate, its fabricating process steps are more complicated than those of the amorphous silicon thin film transistor that forms a single type channel only.

In fabrication of the array substrate including the thin film transistor, a photolithographic process is required several times throughout the manufacturing process.

The photolithographic process includes a series of process steps of forming a desired pattern by transferring a pattern printed on a mask onto a substrate on which a thin film is deposited, wherein the series of process steps include coating, exposing and developing process steps of a photoresist. In this case, problems occur in that the photolithographic process reduces production yield and increases the probability of a thin film transistor having a defect.

Particularly, since the mask designed to form the pattern is expensive, the fabricating cost of the LCD increases proportionally if the number of masks for the process steps increases.

SUMMARY OF THE INVENTION

Therefore, an object of the present invention is to provide a liquid crystal display and a method for fabricating the same, in which the number of masks is reduced to simplify fabricating process steps and improve yield.

To achieve these and other advantages and in accordance with the purpose of the present invention, as embodied and broadly described herein, there is provided a method for fabricating a liquid crystal display, which includes preparing an insulating substrate defining a TFT region of a pixel portion, forming an active layer on the substrate to cover the TFT region of the pixel region, forming a gate electrode of the pixel portion on the active layer, forming a source region of the pixel portion and a drain region of the pixel portion in the active layer at both sides of the gate electrode of the pixel portion, forming a passivation film having first and second contact holes on the substrate having the drain region of the pixel portion, the first and second contact holes respectively exposing the source region of the pixel portion and the drain region of the pixel portion, sequentially forming a transparent conductive film and a metal film on the passivation film, and selectively etching the metal film and the transparent conductive film to form a source electrode pattern of the pixel portion/a source electrode of the pixel portion, which are sequentially deposited to cover the first contact hole, and a drain electrode pattern of the pixel portion/a drain electrode of the pixel portion, which are sequentially deposited to cover the second contact hole.

In another aspect of the present invention, there is provided a liquid crystal display which includes an insulating substrate defined by a TFT region of a pixel portion, an active layer formed on the substrate to cover the TFT region of the pixel region, a gate electrode of the pixel portion formed on the active layer, a source region of the pixel portion and a drain region of the pixel portion formed in the active layer at both sides of the gate electrode of the pixel portion, a passivation film having first and second contact holes, formed on the substrate having the drain region of the pixel portion, the first and second contact holes respectively exposing the source region of the pixel portion and the drain region of the pixel portion, a source electrode pattern of the pixel portion/a source electrode of the pixel portion, which are sequentially deposited on the passivation film to cover the first contact hole, and a drain electrode pattern of the pixel portion/a drain electrode of the pixel portion, which are sequentially deposited on the passivation film to cover the second contact hole.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification illustrate embodiments of the invention and together with the description serve to explain the principles of the invention.

In the drawings.

DETAILED DESCRIPTION OF THE INVENTION

Reference will now be made in detail to embodiments of the present invention, examples of which are illustrated in the accompanying drawings.

Figure 1:
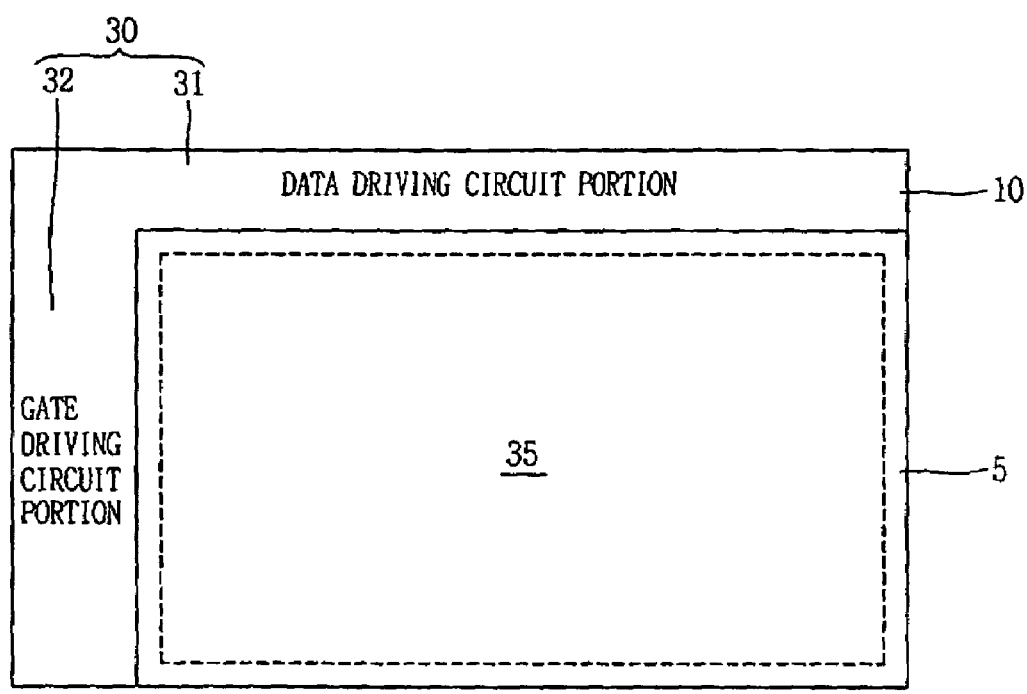
FIG. 1 is a plane view illustrating a structure of a general LCD with a driving circuit.
Figure 2:
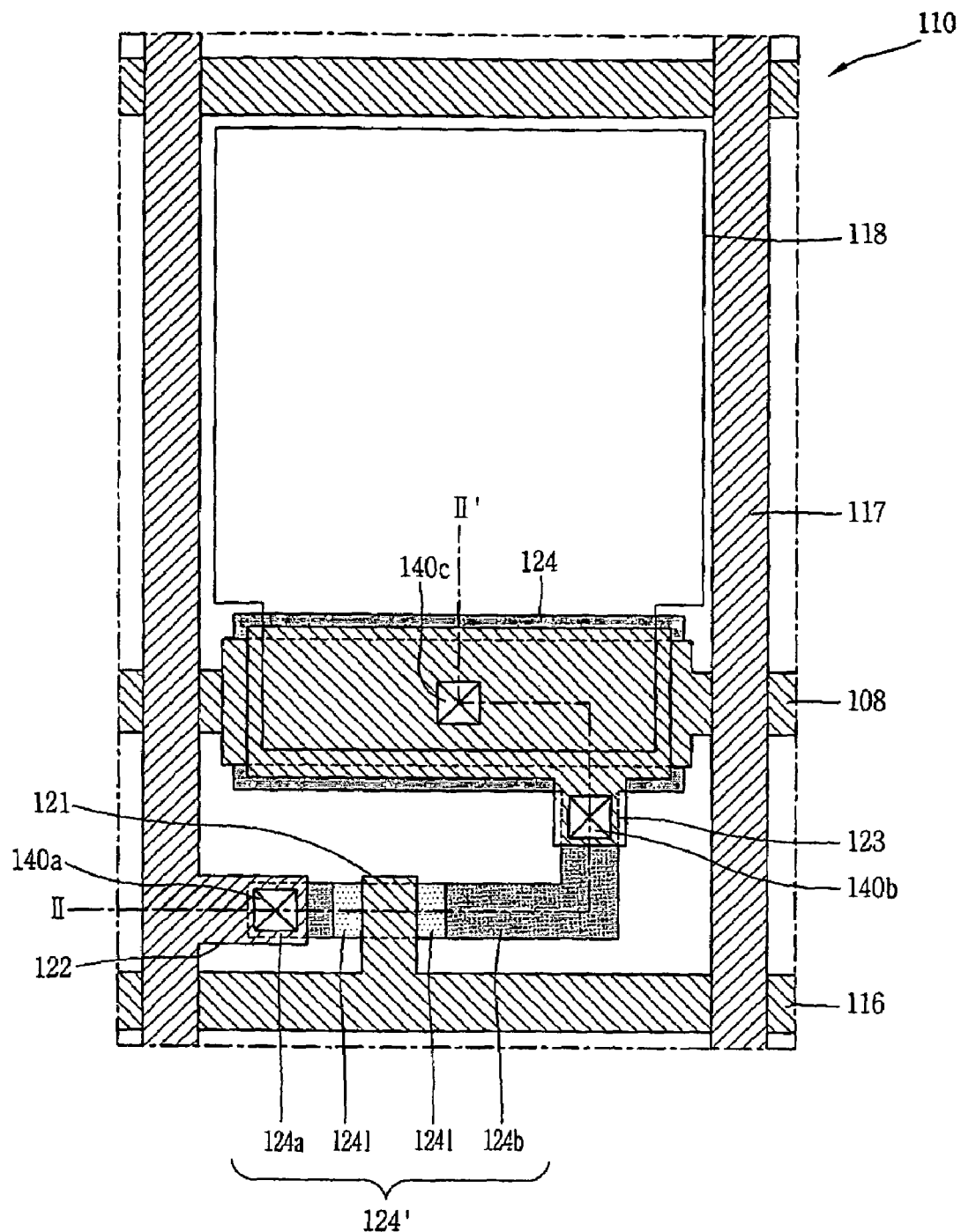
FIG. 2 is a plane view illustrating a part of an array substrate of an LCD according to the first embodiment of the present invention.

FIG. 2 is a plane view illustrating a part of an array substrate of an LCD according to the first embodiment of the present invention. Especially, FIG. 2 illustrates one pixel including a thin film transistor of a pixel portion.

Although an actual LCD includes M×N pixels formed by N gate lines and M data lines, wherein the gate lines cross the data lines, FIG. 2 illustrates one pixel for brief description.

As illustrated in FIG. 2, an array substrate 110 according to the first embodiment of the present invention includes gate and data lines 116 and 117 arranged on the substrate 110 in perpendicular and horizontal directions to define a pixel region, a thin film transistor formed in a portion where the gate line 116 crosses the data line 117, and a pixel electrode 118 formed in the pixel region and connected with the thin film transistor to drive a liquid crystal (not illustrated) along with a common electrode of a color filter substrate (not illustrated).

The thin film transistor includes a gate electrode 121 connected with the gate line 116, a source electrode 122 connected with the data line 117, and a drain electrode 123 connected with the pixel electrode 118. The thin film transistor further includes an active pattern 124' that forms a conductive channel between the source electrode 122 and the drain electrode 123 using a gate voltage supplied to the gate electrode 121.

At this time, the active pattern 124' of the first embodiment is formed of a polycrystalline silicon thin film, and a part of the active pattern 124' is extended to the pixel region to connect with a storage pattern 124" constituting a first storage capacitor along with a common line 108. In other words, the common line 108 is formed in the pixel region in the substantially same direction as that of the gate line 116, and overlaps the storage pattern 124" therebelow to form the first storage capacitor by interposing a first insulating film (not illustrated). At this time, the storage pattern 124" of the first embodiment is formed by storage doping through a separate mask process with respect to the polycrystalline silicon thin film constituting the active pattern 124'.

The source electrode 122 and the drain electrode 123 are electrically connected with source and drain regions of the active pattern 124' through a first contact hole 140a and a second contact hole 140b respectively formed in the first insulating film and a second insulating film (not illustrated). Also, a part of the source electrode 122 is extended in one direction to constitute a part of the data line 117, and a part of the drain electrode 123 is extended to the pixel region to electrically connect with the pixel electrode 118 through a third contact hole 140c formed in a third insulating film (not illustrated).

At this time, the part of the drain electrode 123 extended to the pixel region overlaps the common line 108 therebelow by interposing the second insulating film to form a second storage capacitor.

Hereinafter, fabricating process steps of the aforementioned array substrate will be described with reference to FIGS. 3a to 3i.

FIGS. 3a to 3i are sectional views illustrating sequential fabricating process steps along line II-II' of the array substrate illustrated in FIG. 2. FIGS. 3a to 3i exemplarily illustrate the process of fabricating an array substrate of a pixel portion provided with an n channel TFT.

Figure 3A:
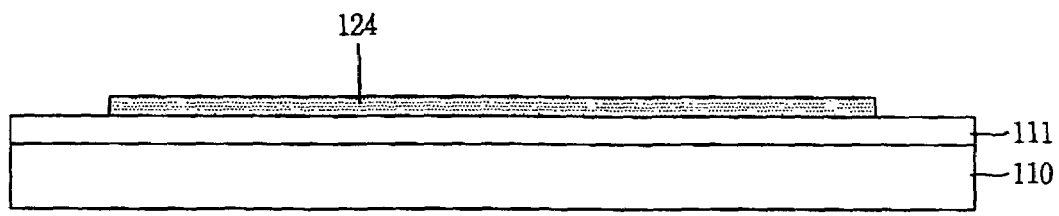
FIGS. 3a to 3i are sectional views illustrating sequential fabricating process steps, taken along line II-II' of the array substrate illustrated in FIG. 2.

As illustrated in FIG. 3a, a silicon thin film is formed on the substrate 110 of a transparent insulating material such as glass and then crystallized to form a polycrystalline silicon thin film. At this time, the substrate 110 is defined by a pixel portion and a circuit portion (not illustrated), wherein the pixel portion is divided into an n channel TFT region and a storage region, and the circuit portion is divided into an n channel TFT region and a p channel TFT region. Afterwards, the polycrystalline silicon thin film is etched to form a polycrystalline silicon thin film pattern 124 that will constitute the active pattern and the storage pattern (first mask process). At this time, a buffer layer 111 may be interposed between the substrate 110 and the polycrystalline silicon thin film pattern 124.

Figure 3B:
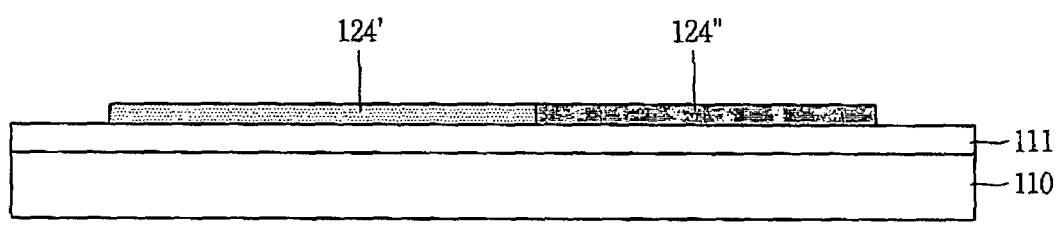

As illustrated in FIG. 3b, the polycrystalline silicon thin film pattern 124 is partially covered by a separate mask (not illustrated) of photoresist to perform doping, whereby the storage pattern 124" is formed. The part of the polycrystalline silicon thin film 124 covered by the photoresist forms the active pattern 124' (second mask process).

Figure 3C:
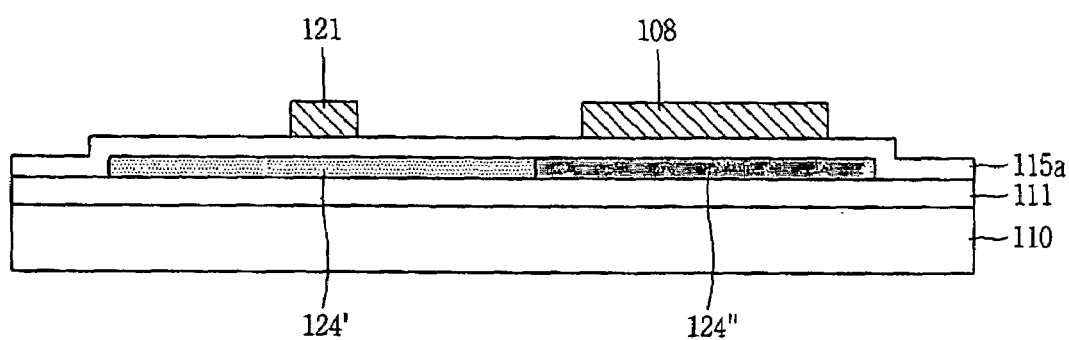

As illustrated in FIG. 3c, a first insulating film 115a and a first conductive film are sequentially formed on the entire surface of the substrate 110, and then the first conductive film is selectively etched to form a gate electrode 121 of the first conductive film on the active pattern 124' and at the same time form the common line of the first conductive film on the storage pattern 124" (third mask process).

The first conductive film may be formed of an opaque conductive material of low resistance, such as aluminum (Al), Al alloy, tungsten (W), copper (Cu), chromium (Cr), and molybdenum (Mo) to form the gate electrode 121 and the common line 108. At this time, the common line 108 overlaps the storage pattern 124" therebelow within the pixel region by interposing the first insulating film 115a to form the first storage capacitor.

Figure 3D:
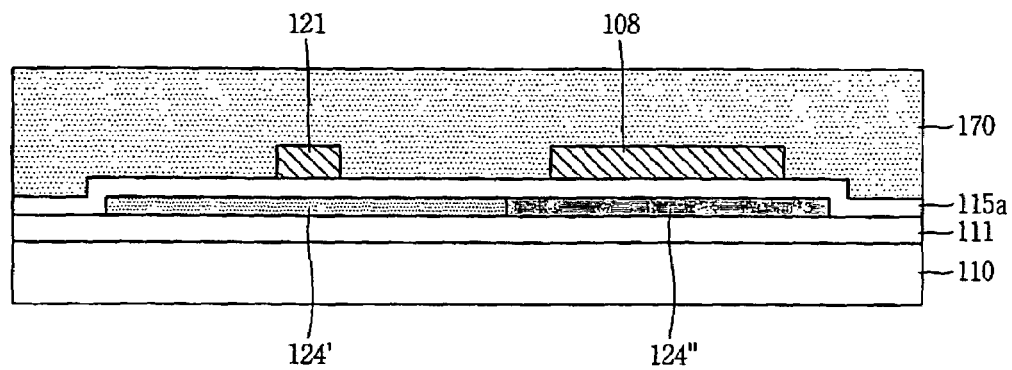

As illustrated in FIG. 3d, a first blocking film 170 is formed on the substrate having the gate electrode 121 and the common line 108. The blocking film 170 is patterned to cover the entire surface of the array substrate 110 of the pixel portion and the n channel TFT region of the circuit portion and to expose the p channel TFT region. In this case, the circuit portion is not illustrated. A heavily doped p+ ion is then implanted into the p channel TFT region of the circuit portion using the first blocking film 170 as a mask to form p+ source and drain regions (not illustrated) (fourth mask process).

Figure 3E:
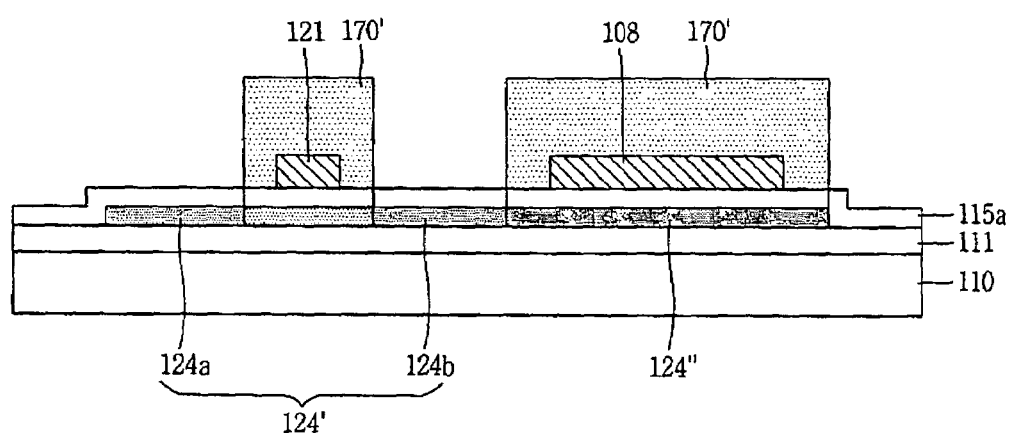

As illustrated in FIG. 3e, the first blocking film is removed. Subsequently, a second blocking film 170' is formed on the substrate having the p+ source and drain regions. The second blocking film 170' is patterned to cover the p channel TFT region of the circuit portion, a part of the n channel TFT region of the pixel/circuit portions, and the storage region. A heavily doped n+ ion is then implanted into the active pattern 124' of the pixel portion using the second blocking film 170' as a mask, whereby n+ source and drain regions 124a and 124b are formed in the active pattern 124' of the pixel portion (fifth mask process).

Figure 3F:
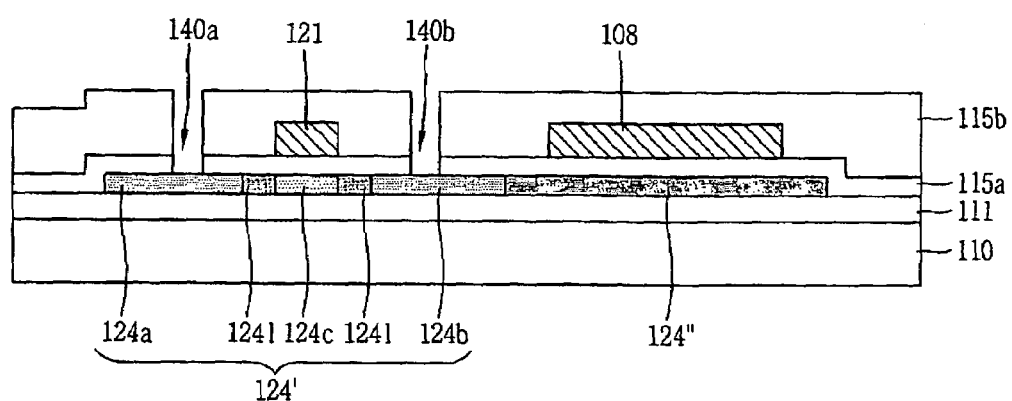

As illustrated in FIG. 3f, the second blocking film 170' is removed, and then a lightly doped n− ion is implanted into the entire surface of the substrate 110 from which the second blocking film is removed, so as to form a lightly doped drain (LDD) region 124l. In FIG. 3f, a reference numeral 124c represents a channel region that forms a conductive channel between the source region 124a and the drain region 124b. In more detail, the LDD region 124l is formed between the source region 124a and the channel region 124c and between the drain region 124b and the channel region 124c. Meanwhile, although not illustrated, while the LDD region 124l is formed in the n channel TFT region of the pixel portion, the n− ion is also implanted into the n channel TFT region of the circuit portion to form the LDD region.

Then, after a second insulating film 115b is deposited on the entire surface of the substrate 110 having the LDD region 124l, the first insulating film 115a and the second insulating film 115b are partially removed to form a first contact hole 140a and a second contact hole 140b, wherein the first contact hole 140a partially exposes the source region 124a, and the second contact hole 140b partially exposes the drain region 124b (sixth mask process).

Figure 3G:
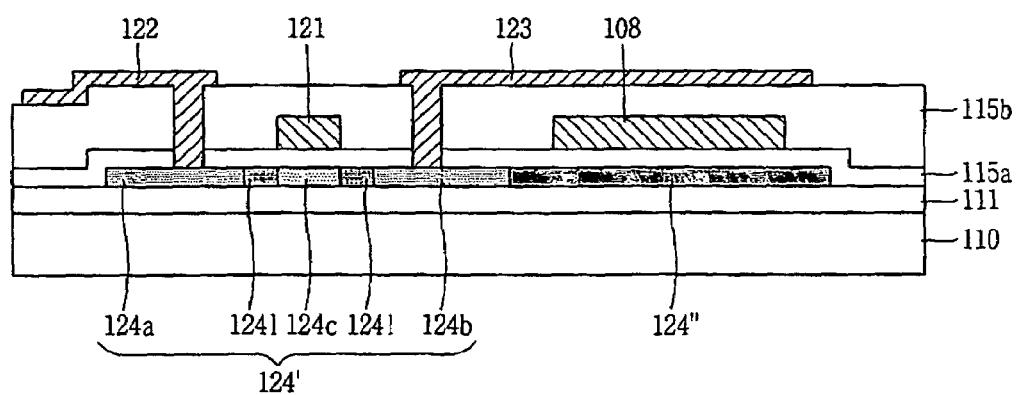

As illustrated in FIG. 3g, a second conductive film is formed on the entire surface of the substrate 110 and then selectively etched to form the source electrode 122 electrically connected with the source region 124a through the first contact hole 140a and also form the drain electrode 123 electrically connected with the drain region 124b through the second contact hole 140b (seventh mask process).

At this time, a part of the source electrode 122 of the pixel portion is extended in one direction to form the data line 117 while a part of the drain electrode 123 of the pixel portion is extended to the pixel region and overlaps the common line 108 therebelow by interposing the second insulating film 115b to form the second storage capacitor.

Figure 3H:
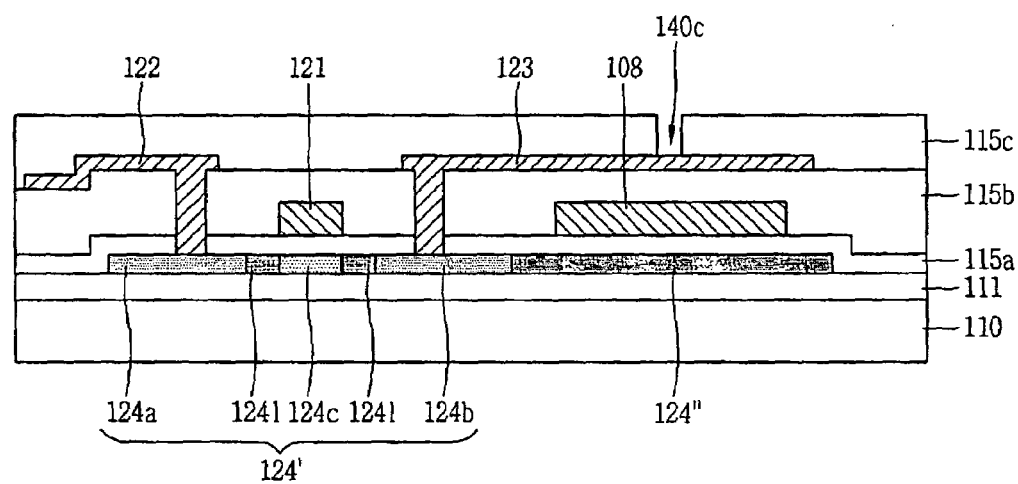

As illustrated in FIG. 3h, a third insulating film 115c is deposited on the entire surface of the substrate 110 and then selectively etched to form a third contact hole 140c that partially exposes the drain electrode 123 (eighth mask process).

Figure 3I:
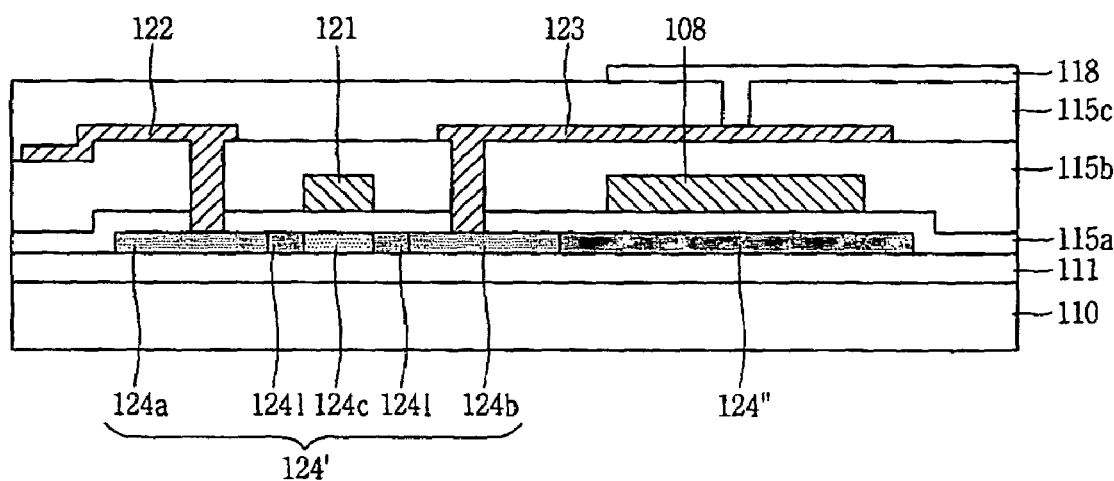

As illustrated in FIG. 3i, a third conductive film is formed on the entire surface of the substrate 110 on which the third insulating film 115c is formed, and then is selectively etched to form the pixel electrode 118 electrically connected with the drain electrode 123 through the third contact hole 140c (ninth mask process).

The third conductive film may be formed of a transparent conductive material having excellent transmittance, such as indium tin oxide (ITO) or indium zinc oxide (IZO), to form the pixel electrode 118.

As described above, in the first embodiment of the present invention, the active pattern and the storage electrode are formed of the polycrystalline silicon thin film, and the storage doping is performed for the storage pattern through separate mask processes, whereby the TFT of the pixel portion and the circuit portion can be fabricated through a total of nine mask processes.

Figure 4:
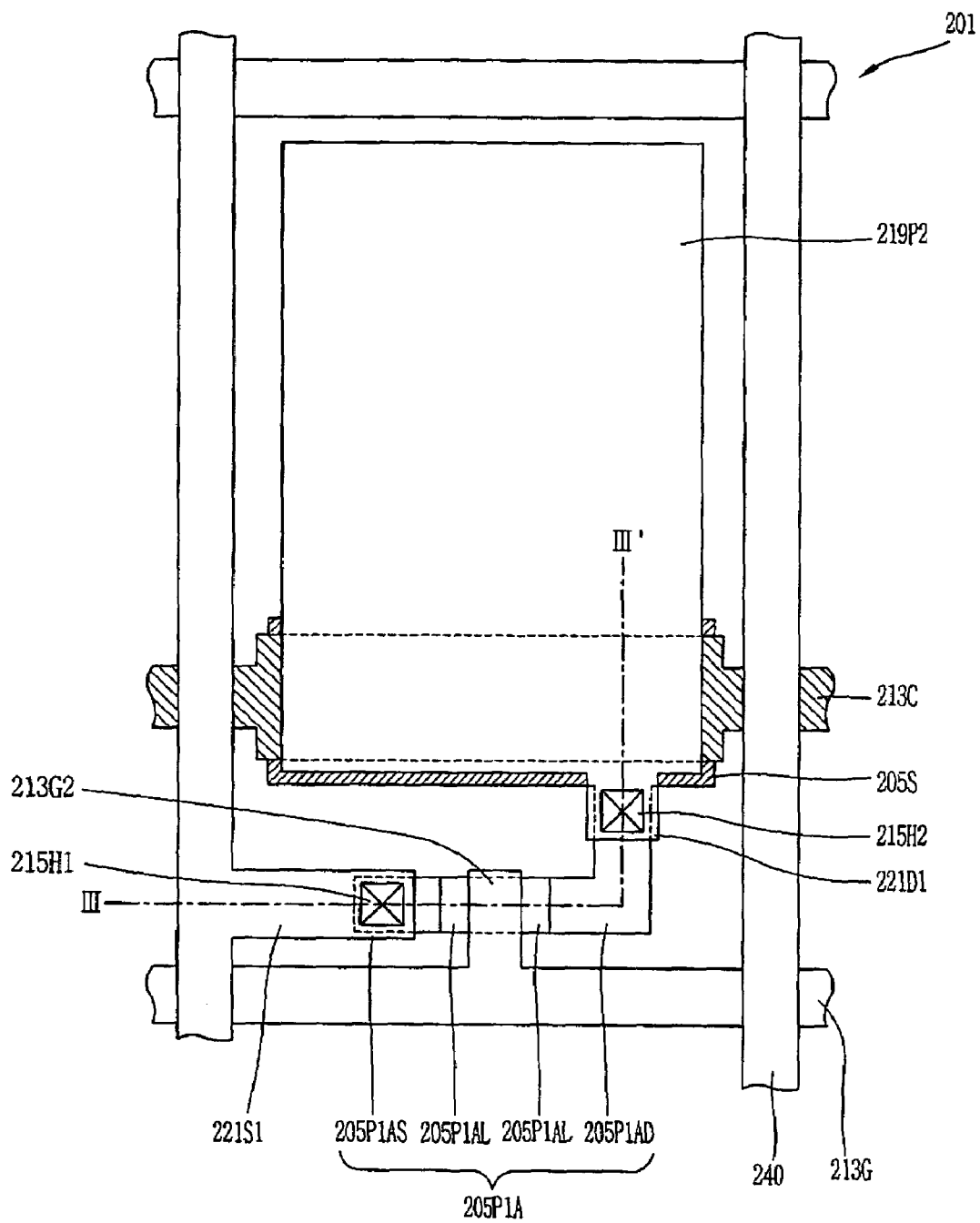
FIG. 4 is a plane view illustrating a part of an array substrate of an LCD according to the second embodiment of the present invention.

FIG. 4 is a plane view illustrating a part of an array substrate of an LCD according to the second embodiment of the present invention.

As illustrated in FIG. 4, an insulating substrate 201 according to the second embodiment of the present invention includes gate and data lines 213G and 240 arranged to define pixel regions in vertical and horizontal directions. The insulating substrate 201 corresponds to an array substrate. A thin film transistor (TFT) serving as a switching device is formed in a portion where the gate line 213G crosses the data line 240, and a drain electrode pattern 219P2 of a pixel portion, which is a pixel electrode, is formed in the pixel region and connected with the TFT to drive a liquid crystal (not illustrated) along with a common electrode (not illustrated) of a color filter substrate (not illustrated).

The TFT includes a gate electrode 213G2 of the pixel portion and source and drain electrodes 221S1 and 221D1 of the pixel portion, wherein the gate electrode 213G2 is connected with the gate line 213G, and the source and drain electrodes 221S1 and 221D1 are connected with the data line 240. The TFT further includes a first active layer 205P1A that forms a conductive channel between the source electrode 221S1 and the drain electrode 221D1 using a gate voltage supplied to the gate electrode 213G2. The first active layer 205P1A is divided into a source region 205P1AS of the pixel region and a drain region 205P1AD of the pixel region. A part of the first active layer 2305P1A is extended to the pixel region (exactly, storage area), and a storage electrode 205S is formed in a portion of the extended first active layer 205P1A.

A common line 213C is formed in the pixel region in a direction substantially the same as that of the gate line 213G. The common line 213C overlaps the storage electrode 205S by interposing a gate insulating film (not illustrated) therebetween to constitute a storage capacitor. The common line 213C may be patterned by the same film as that of the gate electrode 213G.

A passivation film (not illustrated) is arranged on the substrate having the common line 213C3. A first contact hole 215H1 and a second contact hole 215H2 are formed in the passivation film and the gate insulating film, wherein the first contact hole 215H1 exposes the source region 205P1AS of the first active layer 205P1A while the second contact hole 215H2 exposes the drain region 205P1AD of the pixel portion. The source electrode 221S1 and the drain electrode 221D1 are electrically connected with the source and drain regions 205P1AS and 205P1AD of the first active layer 205P1A through the first contact hole 215H1 and the second contact hole 215H2, respectively.

A source electrode pattern 219P1 of the pixel portion is interposed between the source electrode 221S1 and the source region 205P1AS. Also, a drain electrode pattern 219P2 is interposed between the drain electrode 221D1 and the drain region 205P1AD. The drains electrode pattern 219P2 of the pixel portion is arranged to be partially extended to the pixel region. At this time, the drain electrode pattern 219P2 of the pixel portion may correspond to the pixel electrode.

In other words, the source electrode pattern 219P1 and the drain electrode pattern 219P2 are respectively arranged below the source electrode 221S1 of the pixel portion and the drain electrode 221D1 of the pixel portion. The drain electrode pattern 219P2 of the pixel portion and the source electrode pattern 219P1 of the pixel portion are patterned by the same file. The drain electrode pattern 219P2 and the source electrode pattern 219P1 may be pattered by a transparent conductive film.

Figure 5A:
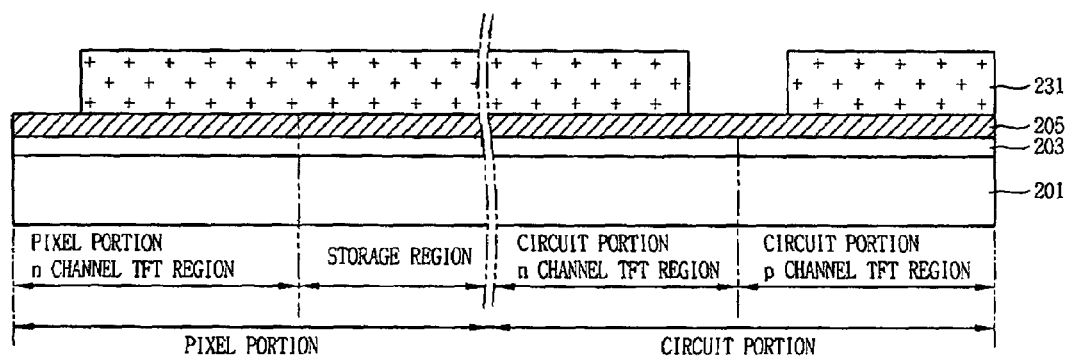
FIGS. 5a to 5k are sectional views taken along line III-III' of FIG. 4.
Figure 5B:
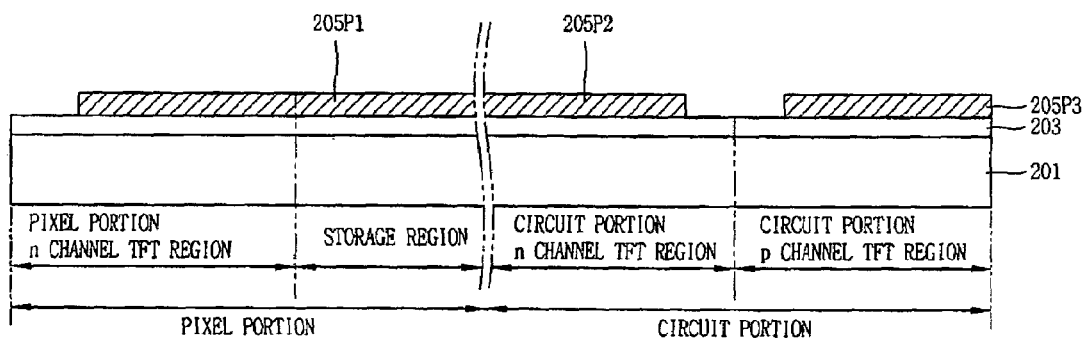
Figure 5C:
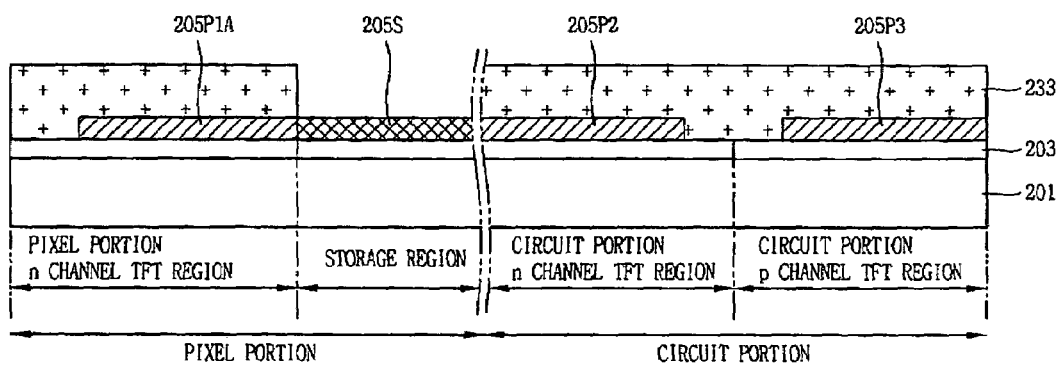
Figure 5D:
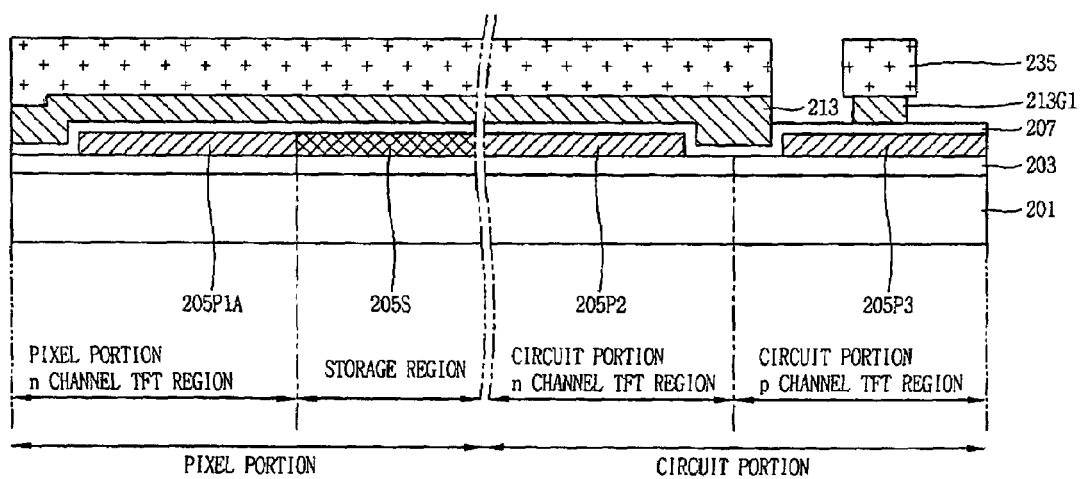
Figure 5E:
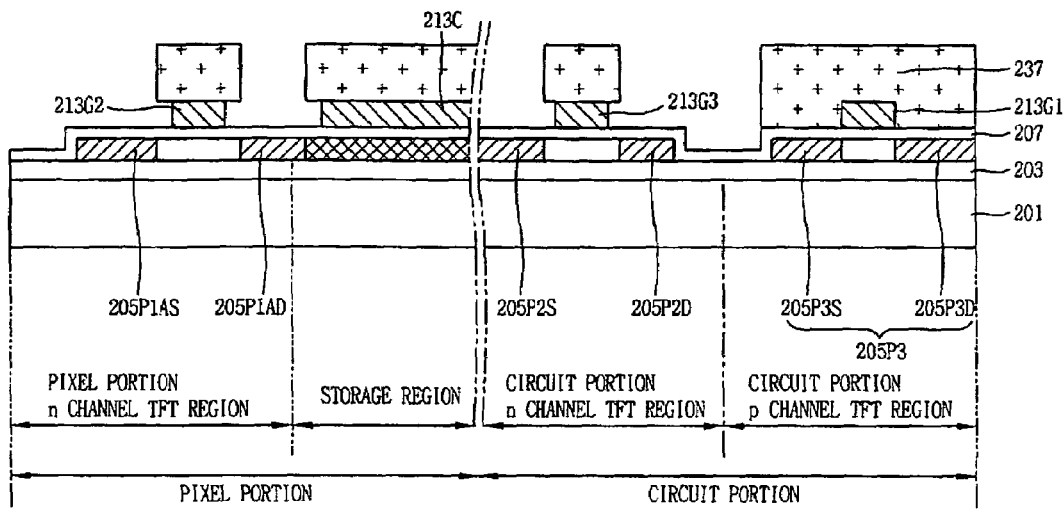
Figure 5F:
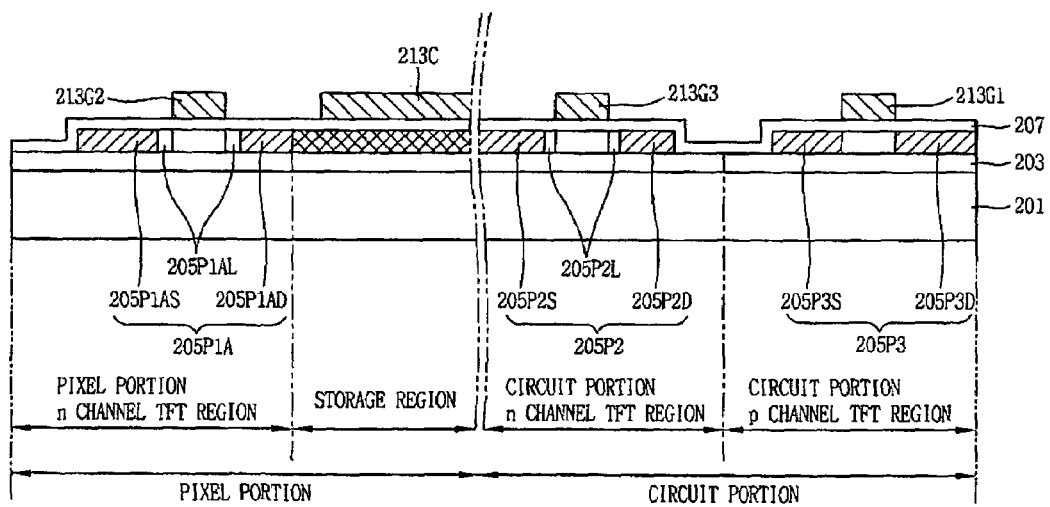
Figure 5G:
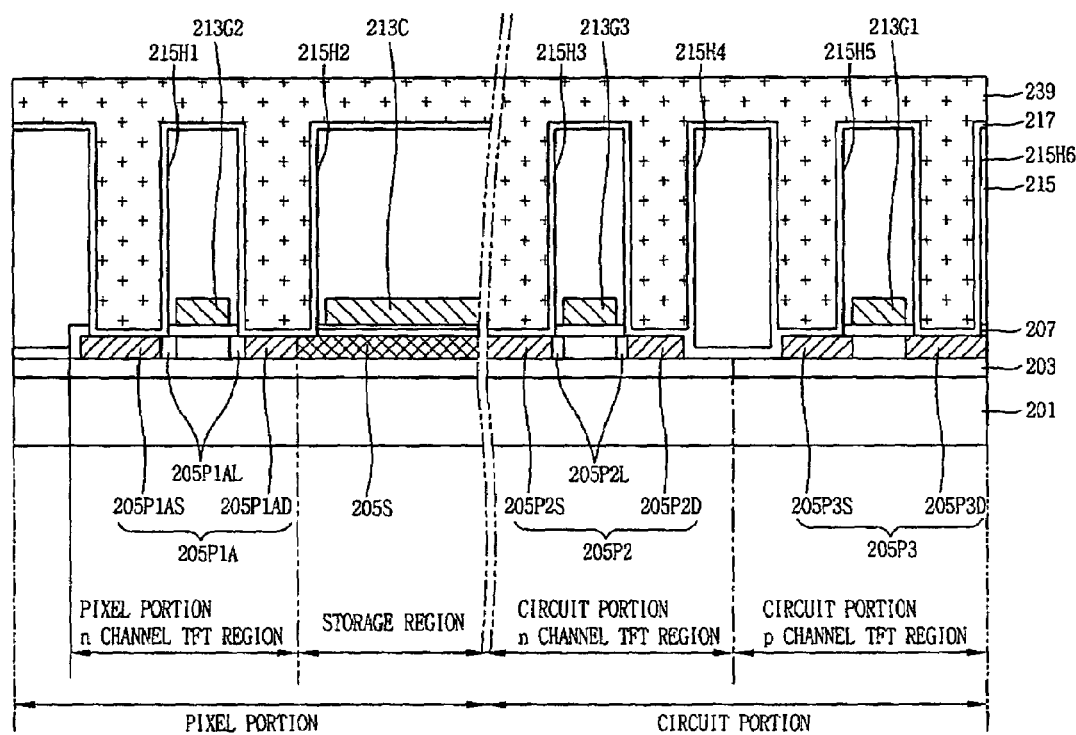
Figure 5H:
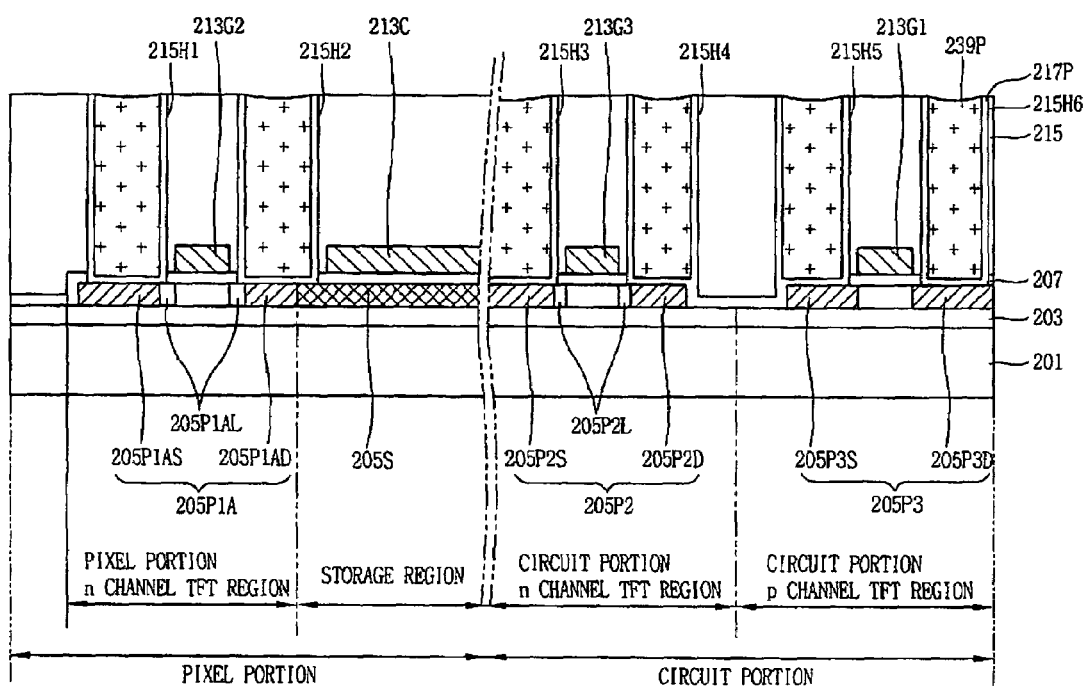
Figure 5I:
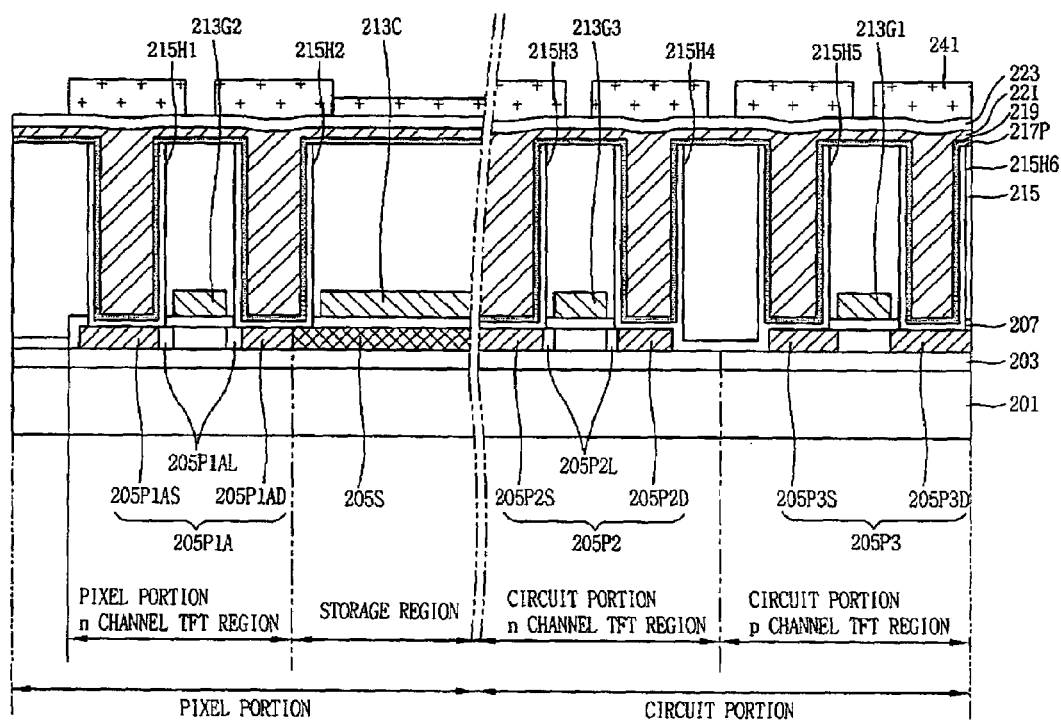
Figure 5J:
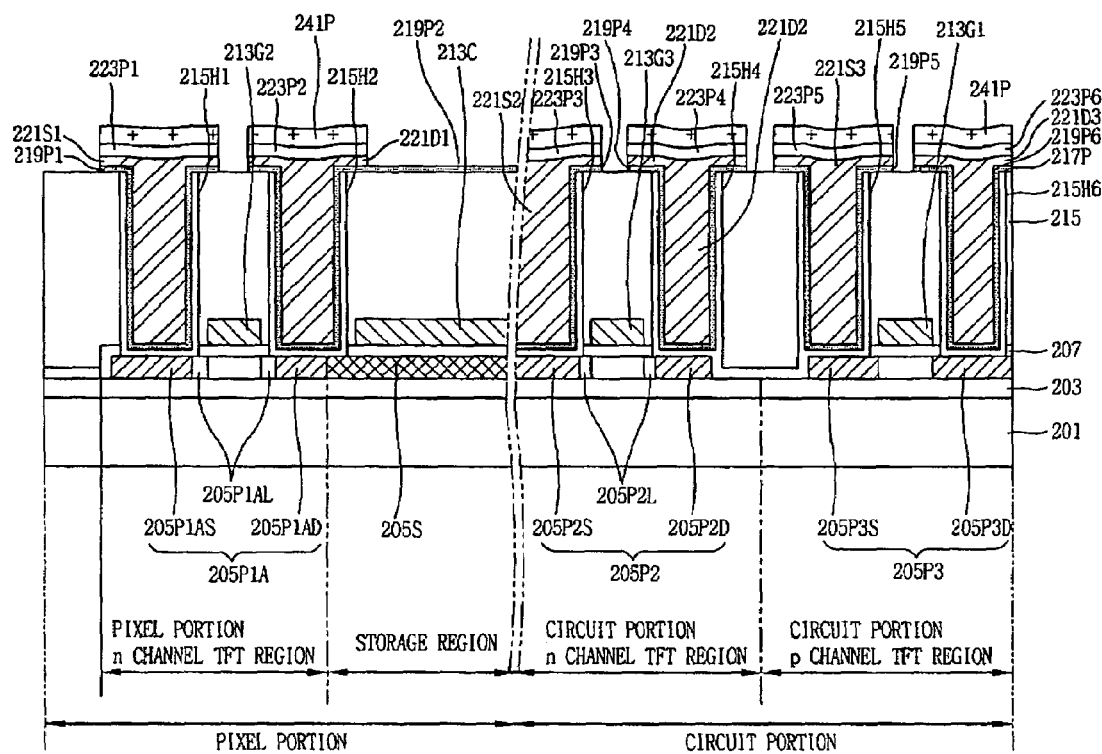
Figure 5K:
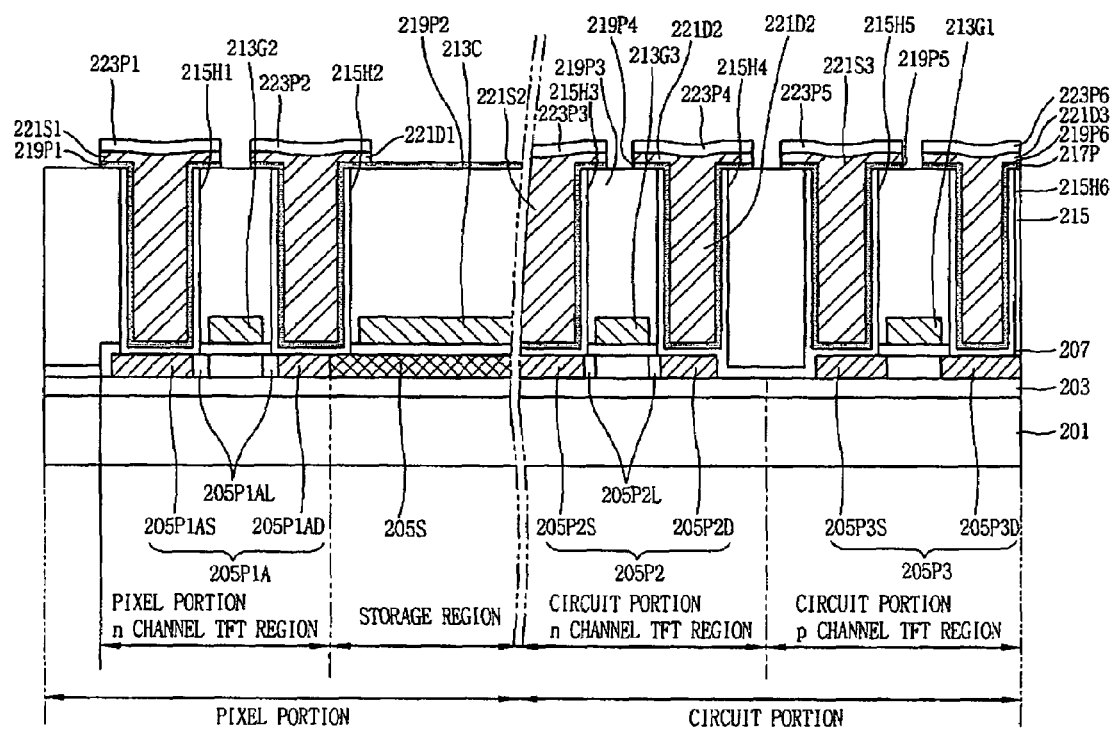
Figure 6:
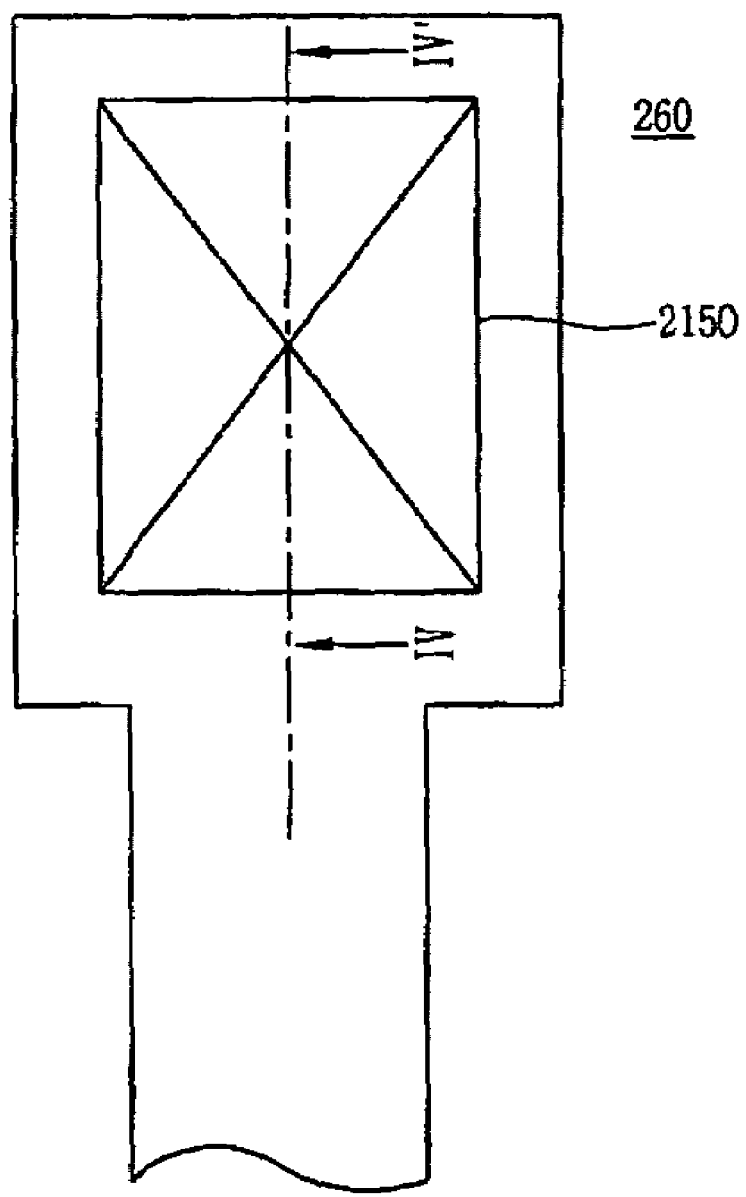
FIG. 6 is a plane view illustrating a pad part of an array substrate of an LCD according to the second embodiment of the present invention.

FIGS. 5a to 5k are sectional views taken along line III-III' of FIG. 4, and FIGS. 7a to 7f are sectional views taken along line □-□' of FIG. 6. Hereinafter, a method for fabricating an LCD according to the second embodiment of the present invention will be described with reference to FIGS. 5a to 5k and 7a to 7f.

Figure 7A:
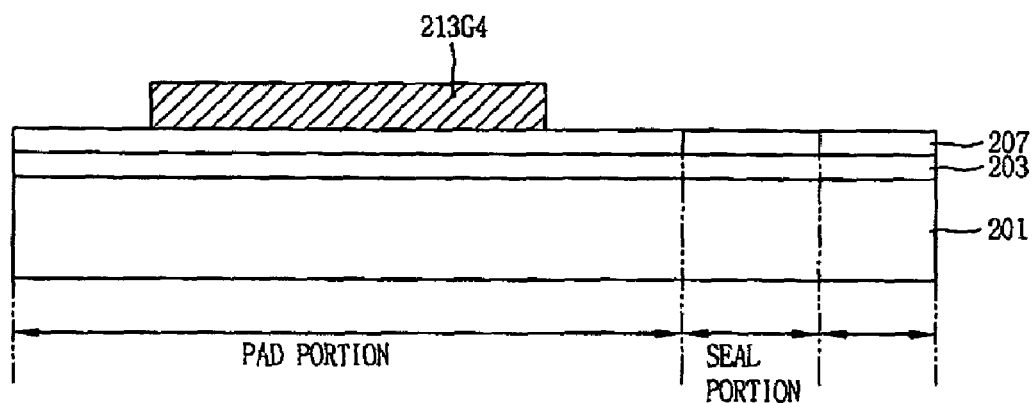
FIGS. 7a to 7f are sectional views taken along line IV-IV''' of FIG. 6.

As illustrated in FIG. 5a and FIG. 7a, an insulating substrate 201 is prepared. A pixel portion, a circuit portion, a gate pad portion, and a sealing line portion are respectively defined in the insulating substrate 201, wherein the pixel portion is divided into are n channel (or p channel) TFT region and a storage region, and the circuit portion is divided into an n channel TFT region and a p channel TFT region. The pixel portion can be provided with both the n channel TFT and the p channel TFT. For convenience, the n channel TFT region of the pixel portion will be described. Also, the circuit portion is provided with both the n channel TFT and the p channel TFT to constitute a CMOS structure.

Subsequently, a buffer layer 203 and a polycrystalline silicon film 205 are sequentially formed on the insulating substrate 201. The polycrystalline silicon film 205 is formed in such a manner that an amorphous silicon film is deposited and then crystallized. Then, a first blocking film 231 is formed on the substrate having the polycrystalline silicon film 205. At this time, the first blocking film 231 is formed to cover a portion of the active layer which will be formed respectively in the n channel TFT region of the pixel portion, the n channel TFT region of the circuit portion, and the p channel TFT region of the circuit portion.

As illustrated in FIG. 5b, the polycrystalline silicon film is etched using the first blocking film as a mask to form first, second and third polycrystalline silicon patterns 205P1, 205P2 and 205P3 of polycrystalline silicon film are formed in the n channel TFT region of the pixel portion, the n channel TFT region of the circuit portion, and the p channel TFT region of the circuit portion (first mask process).

As illustrated in FIG. 5c, the first blocking film is removed. Subsequently, a second blocking film 233 is formed on the substrate having the first, second and third polycrystalline silicon patterns. At this time, the second blocking film 233 is formed to cover the first, second third polycrystalline silicon patterns 205P1, 205P2 and 205P3 and to expose a portion for the first polycrystalline silicon pattern in the storage region. Then, impurity ions are doped into the substrate using the second blocking film 233 as a mask to form a storage electrode 205S. The first polycrystalline silicon pattern 205P1A excluding the storage electrode 205S corresponds to the active layer of the n channel TFT region of the pixel portion, the second polycrystalline silicon pattern 205P2 corresponds to the active layer of the n channel TFT region of the circuit portion, and the third polycrystalline silicon pattern corresponds to the active layer of the p channel TFT region. At this time, the active layer of the n channel TFT region of the pixel portion, the active layer of the n channel TFT region of the circuit portion, and the active layer of the p channel TFT region of the circuit portion will respectively be referred to as the first active layer, the second active layer, and the third active layer (second mask process).

As illustrated in FIG. 5d, the second blocking film is removed. A gate insulating film 207, a first metal film 213 and a third blocking film 235 are sequentially formed on the substrate having the first, second and third active layers 205P1A, 205P2 and 205P3. At this time, the gate insulating film 207 may be a silicon oxide film (SiO$_2$). Also, the third blocking film 235 is formed to cover the pixel portion, the n channel TFT region of the circuit portion, and a part of the p channel TFT region. Afterwards, the first metal film is etched using the third blocking film 235 as a mask to form a first gate electrode 213G1 of the circuit portion in the p channel TFT region of the circuit portion (third mask process). At this time, since the pixel portion and the n channel TFT region of the circuit portion are masked by the second blocking film 233, the first metal film in the pixel portion and the n channel TFT region of the circuit portion is not patterned but remains as it is. Also, an etching process of the first metal film is performed by a wet etching process. Thus, the first gate electrode 213G1 of the circuit portion may excessively be etched laterally. The third blocking film is removed. Subsequently, p+ doping is performed for the substrate having the first gate electrode 213G1 of the circuit portion. As a result, the first source region 205P3S of the circuit portion and the drain region 205P3D of the circuit portion are formed in the third active layer 205P3.

As illustrated in FIG. 5e, the fourth blocking film 237 is formed on the substrate having the first source region of the circuit portion 205P3S and the drain region 205P3D of the circuit portion. At this time, the fourth blocking film 237 is formed to cover a portion for the gate electrode and the common line in the pixel portion, a portion for the second gate electrode in the n channel TFT region of the circuit portion, and the p channel TFT region.

As illustrated in FIG. 5f and FIG. 7a, the remaining first metal film is etched using the third blocking film 237 to form the common line 213C and the gate line provided with the gate electrode 213G2 of the pixel portion. Simultaneously, the second gate electrode 213G3 of the circuit portion is formed in the n channel TFT region of the circuit portion while a first metal layer pattern 213G4 is formed in a gate pad region. (fourth mask process). At this time, the remaining first metal film may be etched by wet etching. As a result, the gate electrode 213G2 of the pixel portion, the common line 213C and the second gate electrode 213G3 of the circuit portion may excessively be etched laterally.

Subsequently, n+ ion doping is performed for the substrate having the fourth blocking film. As a result, the source region 205P1AS of the pixel portion and the drain region 205P1AD of the pixel portion are formed in the first active layer 205P1A below both sides of the gate electrode 213G2 of the pixel portion, and the second source region 205P2S of the circuit portion and the second drain region 205P2D of the circuit portion are formed in the active layer 205P2 below both sides of the second gate electrode 213G3 of the circuit portion.

As illustrated in FIG. 5f, the third blocking film is removed, and then LDD doping (n−) is performed for the entire surface of the substrate using the gate electrode 213G2 of the pixel portion and the second gate electrode 213G3 of the circuit portion as masks. As a result, a first LDD region 205P1AL is formed in the first active layer 205P1A while a second LDD region 205P2L is formed in the second active layer 205P2. The first and second LDD regions 205P1AL and 205P2L are formed as much as wet CD bias, and can be obtained by doping for the entire surface of the substrate in a state that there is no separate mask.

Figure 7B:
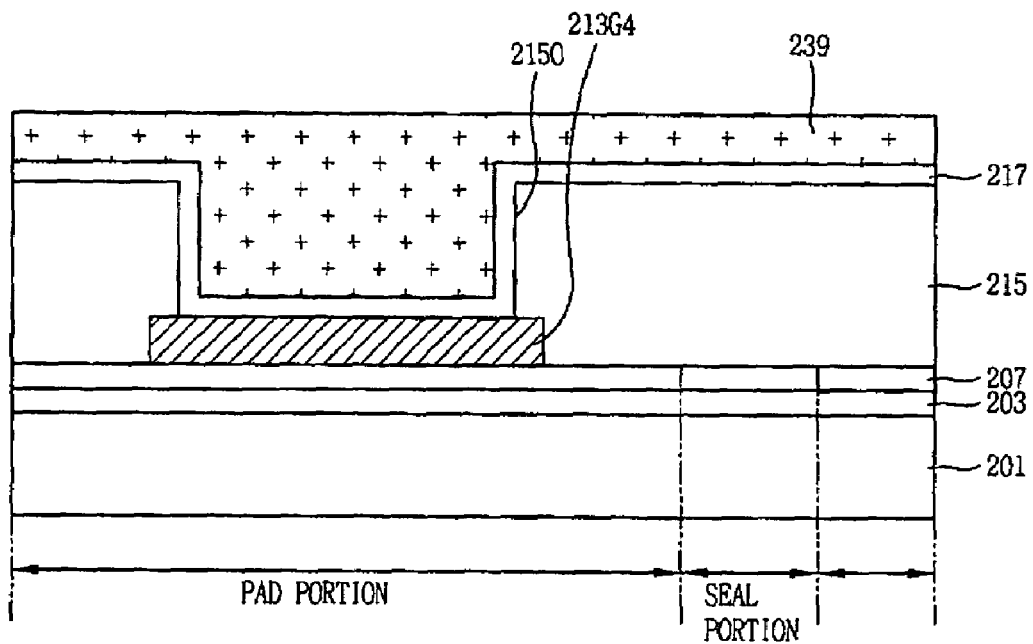

As illustrated in FIGS. 5g and 7b, a passivation film 215 is formed on the substrate having the first and second LDD regions 205P1AL and 205P2L. A silicon oxide film (SiO$_2$) and a silicon nitride film (SiNx) deposited in due order may be used as the passivation film 221. At this time, the passivation film 215 is formed in such a manner that after the silicon oxide film is deposited and undergoes activation annealing, the silicon nitride film is deposited and undergoes hydrogenation annealing (first method). Alternatively, the passivation film 215 is formed in such a manner that the silicon oxide film and the silicon nitride film are sequentially formed and then annealed (second method). If the passivation film 215 is formed by the second method, activation of the silicon oxide film and hydrogenation of the silicon nitride film can be performed simultaneously through annealing of one time.

Meanwhile, a single silicon nitride film may be used as the passivation film 215. As described above, the present invention adopts a structure including the silicon nitride film as the passivation film 215. In this case, the silicon nitride film serves as a hydrogen source that can act on hydrogenation.

However, if a structure of a silicon oxide film (SiO$_2$)/silicon nitride film (SiNx) or a structure of a single silicon nitride film (SiNx) is adopted as the passivation film 215 as described above, the silicon nitride film has a dielectric constant of 6.5 to 7.0 and has greater capacitance per unit area with respect to the same deposition thickness than that of the silicon oxide film having a dielectric constant of 3.9. Accordingly, electric effect increases between the gate and data lines respectively arranged above and below the passivation film 215 and thus signal delay increases, whereby a problem may occur in view of high speed operation and high resolution.

To solve such a problem, the passivation film 215 may be formed in a triple structure of silicon oxide film (SiO$_2$)/silicon nitride film (SiNx)/silicon oxide film (SiO$_2$), wherein the silicon oxide film having a low dielectric constant is deposited on the silicon nitride film. If the triple structure of silicon oxide film (SiO$_2$)/silicon nitride film (SiNx)/silicon oxide film (SiO$_2$) is adopted as the passivation film 215, capacitance per unit area with respect to the same deposition thickness can be smaller than that of the structure of silicon oxide film (SiO$_2$)/silicon nitride film (SiNx) or the structure of silicon nitride film (SiNx). As a result, electric effect decreases between the gate and data lines and thus signal delay decreases, whereby high speed operation or high resolution can be realized.

Next, the passivation film and the gate insulating film are etched using a separate mask (not illustrated) to form first, second, third, fourth, fifth and sixth contact holes 215H1, 215H2, 215H3, 215H4, 215H5, and 215H6 and an opening portion 215O (fifth mask process). The first contact hole 215H1 and the second contact hole 215H2 expose the source region 205P1AS and the drain region 205P1AD of the pixel portion. Also, the third contact hole 2211H3 and the fourth contact hole 221H4 expose the second source region 205P2S of the circuit portion and the second drain region 205P2D of the circuit portion. The fifth contact hole 221H5 and the sixth contact hole 221H6 expose the first source region 205P3S of the circuit portion and the first drain region 205P3D of the circuit portion. The opening portion 215O exposes the first metal layer pattern 213G4.

Next, a barrier metal film 217 is formed on the substrate having the contact holes 215H1, 215H2, 215H3, 215H4, 215H5 and 215H6 and the opening portion 215O. At this time, a molybdenum film is used as the barrier metal film 217.

Also, the barrier metal film 217 has a thickness of 300 Å to 700 Å, for example 500 Å. Subsequently, a blocking film 239 is deposited on the substrate having the barrier metal film 217. At this time, if the passivation film 2125 has a thickness of 1.5 μm to 2.5 μm, or for example 2.0 μm, the blocking film 239 is deposited at a thickness of 0.5 μm to 1.0 μm, or for example 0.8 μm.

Figure 7C:
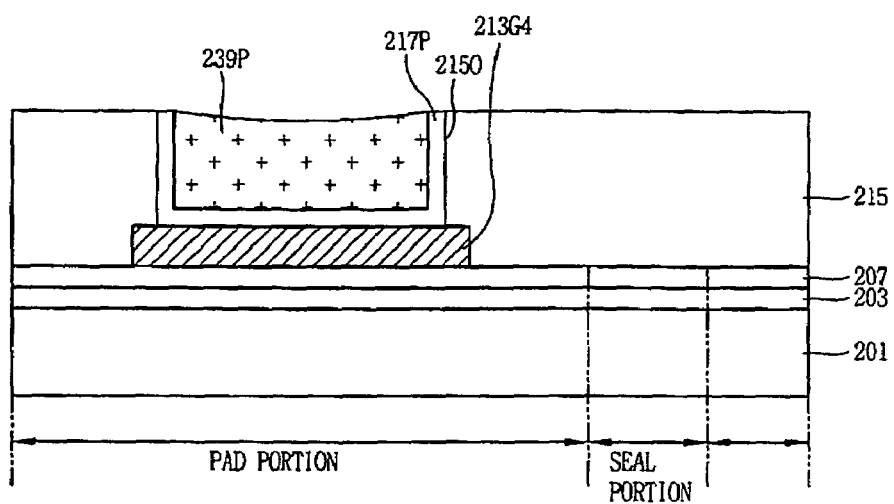

As illustrated in FIGS. 5h and 7c, a fourth blocking film 239P is formed by ashing the blocking film 239. At this time, the fourth blocking film 239P is formed to remain in the first, second third, fourth, fifth and sixth contact holes 215H1, 215H2, 215H3, 215H4, 215H5, 215H6 and opening portion 215O, and to expose the top surface of the passivation film 215. Subsequently, the barrier metal film on the passivation film 215 is selectively removed by wet etching for the substrate having the fourth blocking film 239P. As a result, a barrier metal film pattern 217P is formed to cover the first, second third, fourth, fifth and sixth contact holes 215H1, 215H2, 215H3, 215H4, 215H5, 215H6 and the opening portion 215O. At this time, the barrier metal film pattern 217P may be formed to cover the bottom of the first, second third, fourth, fifth and sixth contact holes 215H1, 215H2, 215H3, 215H4, 215H5, 215H6 depending on the thickness (>2.0 μm) of the passivation film 215. The barrier metal film pattern 217P serves to improve contact resistance among a transparent conductive film which will be formed later, the source region 205PA1S of the pixel portion, the drain region 205PA1D of the pixel portion, the second source region 205P2S of the circuit portion, the second drain region 205P2S of the circuit portion, the first source region 205P3S of the circuit portion, and the first drain region 205P3D of the circuit portion.

Figure 7D:
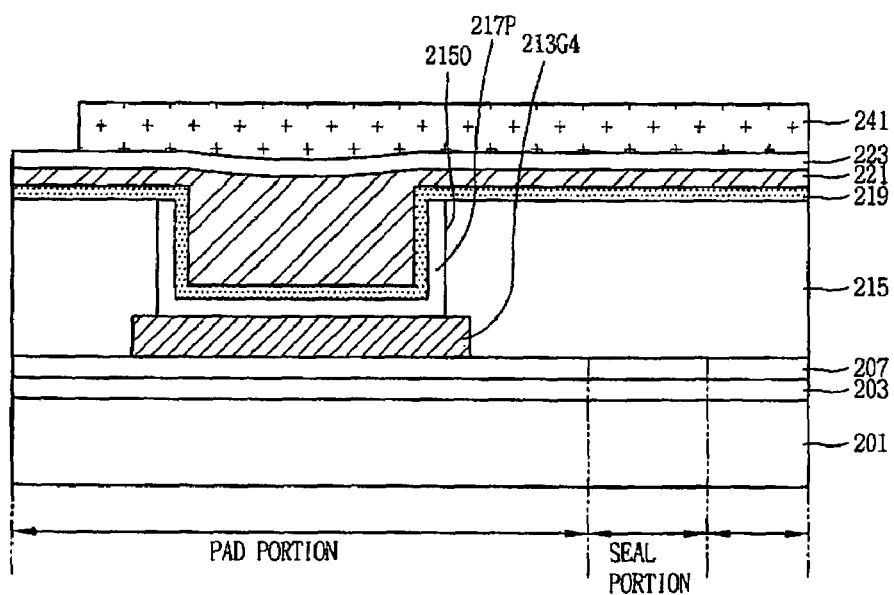

As illustrated in FIG. 5i and FIG. 7d, the fourth blocking film is removed, and then the transparent conductive film 219, a second metal film 221 and an insulating film 223 are formed on the substrate having the barrier metal film pattern 217P. Subsequently, a fifth blocking film 241 is formed on the substrate having the insulating film 223 using a slit or half tone mask (not illustrated). At this time, the fifth blocking film 241 is formed to cover portions corresponding to the opening portion 215O and the first, second, third, fourth, fifth and sixth contact holes 215H1, 215H2, 215H3, 215H4, 215H5 and 215H6 and to allow the n channel TFT region of the circuit portion, the p channel TFT region of the circuit portion and the n channel TFT region of the pixel portion to be more thickly than the storage region of the pixel portion and the gate pad portion.

Figure 7E:
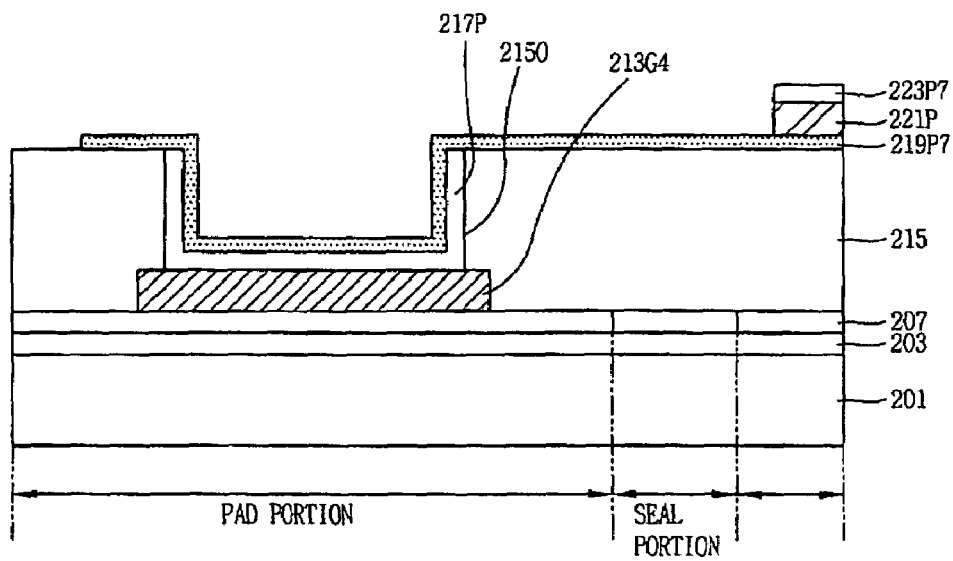

As illustrated in FIG. 5j and FIG. 7e, the insulating film, the second metal film and the transparent conductive film are wet etched using the fifth blocking film as a mask. Subsequently, the sixth blocking film is ashed and then the insulating film and the second metal film exposed by the ashed fifth blocking film pattern 241P (sixth mask process).

As a result, source electrode pattern 219P1 of the pixel portion/source electrode 221S1 of the pixel portion/first insulating pattern 223P1 of the pixel portion and drain electrode pattern 219P2 of the pixel portion/drain electrode 221D1 of the pixel portion/second insulating pattern 223P2 of the pixel portion, which are sequentially deposited to cover the first contact hole 215H1 and the second contact hole 215H2, are formed in the n channel TFT region of the pixel portion. Simultaneously, second source electrode pattern 219P3 of the circuit portion/second source electrode 221S2 of the circuit portion/first insulating pattern 223P3 of the circuit portion and second drain electrode pattern 219P4 of the circuit portion/second drain electrode 221D3 of the circuit portion/second insulating pattern 223P4 of the circuit portion, which are sequentially deposited to cover the third contact hole 215H3 and the fourth contact hole 215H4, are formed. Also, first source electrode pattern 219P5 of the circuit portion/first source electrode 221S3 of the circuit portion/third insulating pattern 223P35 of the circuit portion and first drain electrode pattern 219P6 of the circuit portion/first drain electrode 221D3 of the circuit portion/fourth insulating pattern 223P6 of the circuit portion, which are sequentially deposited to cover the fifth contact hole 215H5 and the sixth contact hole 215H6, are formed in the p channel TFT region of the circuit portion. At this time, the drain electrode pattern 219P2 of the pixel portion may be a pixel electrode. Meanwhile, a transparent conductive film pattern 219P7 is formed in the pad portion to cover the opening portion 215O. the transparent conductive film pattern 219P7 is connected to the first metal layer pattern 219P7 through the opening portion 215O.

Meanwhile, the first insulating pattern 223P1 of the pixel portion, the second insulating pattern 223P2 of the pixel portion, the first insulating pattern 223P3 of the circuit portion, the second insulating pattern 223P4 of the circuit portion, the third insulating pattern 223P35 of the circuit portion, and the fourth insulating pattern 223P6 of the circuit portion serve to reduce common electrode capacitance with the color filter substrate during cell bonding process. Thus, liquid crystal delay can be avoided.

Figure 7F:
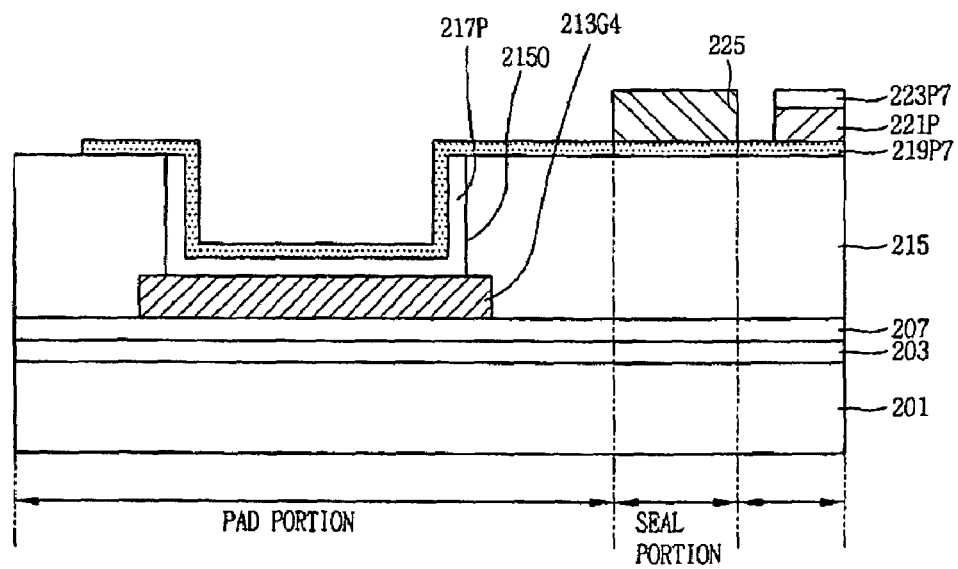

As illustrated in FIG. 5k and FIG. 7f, the ashed fifth blocking film is removed and then a sealing line 225 is formed in the sealing line portion.

As described above, in the second embodiment of the present invention, the process steps of fabricating an LCD include forming the active layer (first mask process), forming the storage electrode (second mask process), forming the first gate electrode of the circuit portion in the p channel TFT region of the circuit portion, forming the gate electrode of the pixel portion, the common electrode, and the second gate electrode of the circuit portion (fourth mask process), forming the contact holes and the opening portion in the passivation film (fifth mask process), and forming the source electrode pattern of the pixel portion/the source electrode of the pixel portion and the drain electrode pattern of the pixel portion/the drain electrode of the pixel electrode and the second source electrode pattern of the circuit portion/the second source electrode of the circuit portion and the second drain electrode pattern of the circuit portion/the second drain electrode of the circuit portion and the first source electrode pattern of the circuit portion/the first source electrode of the circuit portion and the first drain electrode pattern of the circuit portion/the first drain electrode of the circuit portion and the transparent conductive film pattern (sixth mask process), which are sequentially deposited. Accordingly, a CMOS structure of six masks can be realized at a high aperture ratio.

The LCD and the method for fabricating the same according to the present invention have the following advantages.

The pixel electrode and the source electrode/drain electrode are formed using a single mask by the diffraction exposure process. Accordingly, the number of the masks used for fabrication of the thin film transistor can be reduced, and thus the fabricating process steps and the fabricating cost can be reduced.

In the present invention, since the transparent conductive film pattern is formed in the contour of the sealing line portion as well as the gate pad portion, it is possible to minimize damage due to corrosion.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for fabricating a liquid crystal display, comprising:

preparing an insulating substrate defining a TFT region of a pixel portion;

forming an active layer on the substrate to cover the TFT region of the pixel region;

forming a gate electrode of the pixel portion on the active layer;

forming a source region of the pixel portion and a drain region of the pixel portion in the active layer at both sides of the gate electrode of the pixel portion;

forming a passivation film having first and second contact holes on the substrate having the drain region of the pixel portion, the first and second contact holes respectively exposing the source region of the pixel portion and the drain region of the pixel portion;

sequentially forming a transparent conductive film and a metal film on the passivation film;

forming an insulating film on the metal film;

selectively etching the insulating film to form a first insulating pattern and a second insulating pattern of the pixel portion; and selectively etching the metal film and the transparent conductive film to form a source electrode pattern on the first insulating pattern of the pixel portion and a source electrode on the second insulating pattern of the pixel portion, which are sequentially deposited to cover the first contact hole, and a drain electrode pattern of the pixel portion/a drain electrode of the pixel portion, which are sequentially deposited to cover the second contact hole.

2. The method as claimed in claim 1, further comprising forming a gate insulating film on the substrate having the active layer before forming the gate electrode of the pixel portion.

3. The method as claimed in claim 1, wherein the passivation film is formed by depositing and activation annealing a silicon oxide film on the substrate having the drain region of the pixel portion, and depositing and hydrogenation annealing a silicon nitride film on the activated silicon oxide film.

4. The method as claimed in claim 1, wherein the passivation film is formed by sequentially forming a silicon oxide film and a silicon nitride film on the substrate having the drain region, and simultaneously performing activation of the silicon oxide film and hydrogenation of the silicon nitride film after annealing the silicon nitride film and the silicon oxide film.

5. The method as claimed in claim 1, wherein the passivation film is formed by sequentially forming a silicon oxide film, a silicon nitride film and a silicon oxide film on the substrate having the drain region.

6. The method as claimed in claim 1, further comprising forming a barrier metal pattern filled in the first and second contact holes, after forming the passivation film.

7. The method as claimed in claim 6, wherein the barrier metal pattern is formed by forming a barrier metal film on the passivation film to cover the first and second contact holes, depositing a blocking film on the substrate having the barrier metal film, ashing the blocking film to form a blocking film pattern exposing the barrier metal film and remaining in the first and second contact holes, etching the barrier metal film exposed by the blocking film pattern, and removing the blocking film pattern.

8. The method as claimed in claim 7, wherein the barrier metal film is formed of molybdenum film.

9. The method as claimed in claim 7, wherein the barrier metal film is formed at a thickness of 0.5 µm to 0.1 µm.

10. The method as claimed in claim 1, wherein the source electrode pattern of the pixel portion/the source electrode of the pixel portion and the drain electrode pattern of the pixel portion/the drain electrode of the pixel portion are formed by diffraction exposure using a single mask.

11. A method for fabricating a liquid crystal display, comprising:

preparing an insulating substrate defining a TFT region of a pixel portion and a circuit portion, the circuit portion being divided into an n channel TFT region and a p channel TFT region;

forming first, second and third active layers on the substrate at the same level, to respectively cover the TFT region of the pixel portion, the n channel TFT region and the p channel TFT region;

forming a first gate electrode of the pixel portion on the third active layer;

sequentially forming a first source region of the circuit portion and a first drain region of the circuit portion in the third active layer at both sides of the first gate electrode of the circuit portion;

forming a gate electrode of the pixel portion and a second gate electrode of the circuit portion on the first and second active layers;

forming a source region of the pixel portion and a drain region of the pixel portion in the first active layer at both sides of the gate electrode of the pixel portion, and at the same time forming a second source region of the circuit portion and a second drain region of the circuit portion in the second active layer at both sides of the second gate electrode of the circuit portion;

forming a passivation film having first, second, third, fourth, fifth and sixth contact holes on the substrate having the second drain region of the circuit portion, the first, second, third, fourth, fifth and sixth contact holes respectively exposing the source region of the pixel portion, the drain region of the pixel portion, the second source region of the circuit portion, the second drain region of the circuit portion, the first source region of the circuit portion, and the first drain region of the circuit portion;

sequentially forming a transparent conductive film and a metal film on the passivation film; and selectively etching the metal film and the transparent conductive film to form a source electrode pattern of the pixel portion/a source electrode of the pixel portion, a second source electrode pattern of the circuit portion/a second source electrode of the circuit portion and a first source electrode pattern of the circuit portion/a first source electrode pattern of the circuit portion, which are sequentially deposited to cover the first, third and fifth contact holes, and at the same time to form a drain electrode pattern of the pixel portion/a drain electrode of the pixel portion, a second drain electrode pattern of the circuit portion/a second drain electrode pattern of the circuit portion, and a first drain electrode pattern of the circuit portion/a first drain electrode of the circuit portion, which are sequentially deposited to cover the second, fourth and sixth contact holes.

12. The method as claimed in claim 11, further comprising forming a barrier metal pattern filled in the first and second contact holes, after forming the passivation film.

13. The method as claimed in claim 12, wherein the barrier metal pattern is formed by forming a barrier metal film on the passivation film to cover the first and second contact holes, depositing a blocking film on the substrate having the barrier metal film, ashing the blocking film to form a blocking film pattern exposing the barrier metal film and remaining in the first and second contact holes, etching the barrier metal film exposed by the blocking film pattern, and removing the blocking film pattern.

14. The method as claimed in claim 13, wherein the barrier metal film is formed of molybdenum film at a thickness of 0.5 μm to 0.1 μm.

15. The method as claimed in claim 11, wherein the source electrode pattern of the pixel portion/the source electrode of the pixel portion, the second source electrode pattern of the circuit portion/the second source electrode of the circuit portion, the first source electrode pattern of the circuit portion/the first source electrode pattern of the circuit portion, the drain electrode pattern of the pixel portion/the drain electrode of the pixel portion, the second drain electrode pattern of the circuit portion/the second drain electrode pattern of the circuit portion, and the first drain electrode pattern of the circuit portion/ the first drain electrode of the circuit portion, which are sequentially deposited, are formed by diffraction exposure using a single mask.

16. A liquid crystal display comprising:
an insulating substrate defined by a TFT region of a pixel portion;
an active layer formed on the substrate to cover the TFT region of the pixel region;
a gate electrode of the pixel portion formed on the active layer;
a source region of the pixel portion and a drain region of the pixel portion formed in the active layer at both sides of the gate electrode of the pixel portion;
a passivation film having first and second contact holes, formed on the substrate having the drain region of the pixel portion, the first and second contact holes respectively exposing the source region of the pixel portion and the drain region of the pixel portion;
a source electrode pattern of the pixel portion/a source electrode of the pixel portion, which are sequentially deposited on the passivation film to cover the first contact hole, and a drain electrode pattern of the pixel portion/a drain electrode of the pixel portion, which are sequentially deposited on the passivation film to cover the second contact hole; and
a barrier metal pattern formed in the first and second contact holes and interposed between the source region of the pixel portion and the source electrode pattern and between the drain region of the pixel portion and the drain electrode pattern.

17. The liquid crystal display as claimed in claim 16, further comprising a gate insulating film deposited on the source electrode, and a second insulating pattern deposited on the drain electrode.

18. The liquid crystal display as claimed in claim 16, further comprising a gate insulating film interposed between the active layer and the gate electrode of the pixel portion.

19. The liquid crystal display as claimed in claim 16, wherein the passivation film is formed of any one of a single silicon nitride film (SiNx), a silicon oxide film ($SiO_2$)/a silicon nitride film (SiNx), which are sequentially deposited, and a silicon oxide film ($SiO_2$)/a silicon nitride film (SiNx)/a silicon oxide film ($SiO_2$), which are sequentially deposited.

20. The liquid crystal display as claimed in claim 16, wherein the barrier metal pattern is formed of molybdenum film.

21. The liquid crystal display as claimed in claim 16, wherein the source electrode pattern of the pixel portion/the drain electrode pattern of the pixel portion are formed of transparent conductive films, and the source electrode of the pixel portion/the drain electrode of the pixel portion are formed of metal films.

22. The liquid crystal display as claimed in claim 16, wherein the drain electrode pattern of the pixel portion is a pixel electrode.

23. A liquid crystal display comprising:
an insulating substrate defined by a TFT region of a pixel portion, a gate pad region, and a sealing line region arranged between the TFT region of the pixel portion and the gate pad region;
an active layer formed on the substrate to cover the TFT region of the pixel region;
a gate electrode and a gate pad respectively formed on a gate pad region on the substrate and the active layer;
a source region of the pixel portion and a drain region of the pixel portion in the active layer at both sides of the gate electrode of the pixel portion;
a passivation film having first and second contact holes and an opening portion on the substrate having the drain region of the pixel portion, the first and second contact holes respectively exposing the source region of the pixel portion and the drain region of the pixel portion, and the opening portion exposing the gate pad;
a source electrode pattern of the pixel portion/a source electrode of the pixel portion, which are sequentially deposited to cover the first contact hole, a drain electrode pattern of the pixel portion/a drain electrode of the pixel portion, which are sequentially deposited to cover the second contact hole, and a transparent conductive film pattern of a pad portion covering the opening portion and the sealing line region; and
a barrier metal pattern formed in the first and second contact holes and interposed between the source region of the pixel portion and the source electrode pattern and between the drain region of the pixel portion and the drain electrode pattern.

24. The liquid crystal display as claimed in claim 23, wherein the barrier metal pattern is formed of molybdenum film.

25. The liquid crystal display as claimed in claim 23, wherein the source electrode pattern of the pixel portion, the drain electrode pattern of the pixel portion, and the transparent conductive film pattern of the pad portion are formed of transparent conductive films, and the source electrode of the pixel portion and the drain electrode of the pixel portion are formed of metal films.

26. A liquid crystal display, comprising:
an insulating substrate defined by a TFT region of a pixel portion and a circuit portion, the circuit portion being divided into an n channel TFT region and a p channel TFT region;
first, second and third active layers on the substrate at the same level, to respectively cover the TFT region of the pixel portion, the n channel TFT region and the p channel TFT region;
a gate electrode of the pixel portion and second and first gate electrodes of the circuit portion respectively formed on the first, second third active layers;

a source region of the pixel portion and a drain region of the pixel portion formed in the first active layer at both sides of the gate electrode of the pixel portion, a second source region of the circuit portion and a second drain region of the circuit portion formed in the second active layer at both sides of the second gate electrode of the circuit portion, and a first source region of the circuit portion and a first drain region of the circuit portion formed in the third active layer at both sides of the first gate electrode of the circuit portion;

a passivation film formed on the substrate having the first drain region of the circuit portion, having first, second, third, fourth, fifth and sixth contact holes respectively exposing the source region of the pixel portion, the drain region of the pixel portion, the second source region of the circuit portion, the second drain region of the circuit portion, the first source region of the circuit portion, and the first drain region of the circuit portion;

a source electrode pattern of the pixel portion/a source electrode of the pixel portion, which are sequentially deposited on the passivation film to cover the first contact hole, a drain electrode pattern of the pixel portion/a drain electrode of the pixel portion, which are sequentially deposited to cover the second contact hole, a second source electrode pattern of the circuit portion/a second source electrode of the circuit portion, which are sequentially deposited to cover the third contact hole, a second drain electrode pattern of the circuit portion/a second drain electrode of the circuit portion, which are sequentially deposited to cover the fourth contact hole, a first source electrode pattern of the circuit portion/a first source electrode of the circuit portion, which are sequentially deposited to cover the fifth contact hole, and a first drain electrode pattern of the circuit portion/a first drain electrode of the circuit portion, which are sequentially deposited to cover the sixth contact hole; and a barrier metal pattern filled in the first, second, third, fourth, fifth and sixth contact holes and respectively interposed between the source region of the pixel portion and the source electrode pattern of the pixel portion, between the drain region of the pixel portion and the drain electrode pattern of the pixel portion, between the second source region of the circuit portion and the second source electrode pattern of the circuit portion, between the second drain region of the circuit portion and the second drain electrode pattern of the circuit portion, between the first source region of the circuit portion and the first source electrode pattern of the circuit portion, and between the first drain region of the circuit portion and the first drain electrode pattern of the circuit portion.

27. The liquid crystal display as claimed in claim 26, wherein the barrier metal pattern is formed of molybdenum film.

28. The liquid crystal display as claimed in claim 26, wherein the source electrode pattern of the pixel portion/the drain electrode pattern of the pixel portion, the second source electrode pattern of the circuit portion/the second drain electrode pattern of the circuit portion, and the first source electrode pattern of the circuit portion/the first drain electrode pattern of the circuit portion are formed of transparent conductive films, and the source electrode of the pixel portion/the drain electrode of the pixel portion, the second source electrode of the circuit portion/the second drain electrode of the circuit portion, and the first source electrode of the circuit portion/the first drain electrode of the circuit portion are formed of metal films.

* * * * *